United States Patent
Wang et al.

(10) Patent No.: US 11,175,179 B2
(45) Date of Patent: Nov. 16, 2021

(54) CALIBRATION CIRCUIT FOR USE IN SENSOR AND RELATED SENSOR THEREOF

(71) Applicants: Egis Technology Inc., Taipei (TW); Igistec Co., Ltd., Hsinchu County (TW)

(72) Inventors: Chung-Yi Wang, Hsinchu County (TW); Yu-Hsuan Lin, Hsinchu County (TW)

(73) Assignee: Egis Technology Inc., Hsinchu (TW)

( * ) Notice: Subject to any disclaimer, the term of this patent is extended or adjusted under 35 U.S.C. 154(b) by 10 days.

(21) Appl. No.: 16/733,256

(22) Filed: Jan. 3, 2020

(65) Prior Publication Data

US 2020/0340855 A1 Oct. 29, 2020

Related U.S. Application Data

(60) Provisional application No. 62/837,736, filed on Apr. 24, 2019.

(30) Foreign Application Priority Data

Nov. 15, 2019 (CN) .......................... 201911119483.6

(51) Int. Cl.
*G01J 1/44* (2006.01)
*H03F 3/45* (2006.01)

(52) U.S. Cl.
CPC .................. *G01J 1/44* (2013.01); *H03F 3/45* (2013.01); *G01J 2001/444* (2013.01); *H03F 2203/45151* (2013.01); *H03F 2203/45156* (2013.01)

(58) Field of Classification Search
CPC .......... G01J 1/44; G01J 2001/444; G01J 1/46; H03F 3/45; H03F 2203/45151;
(Continued)

(56) References Cited

U.S. PATENT DOCUMENTS

| | | | |
|---|---|---|---|
| 2012/0287077 A1* | 11/2012 | Pant ..................... | G06F 3/0446 345/174 |
| 2014/0015746 A1* | 1/2014 | Hargreaves .......... | G06F 3/0383 345/157 |

(Continued)

FOREIGN PATENT DOCUMENTS

| | | |
|---|---|---|
| CN | 203177993 U | 9/2013 |
| CN | 206740271 U | 12/2017 |

(Continued)

*Primary Examiner* — Thanh Luu
*Assistant Examiner* — Monica T Taba
(74) *Attorney, Agent, or Firm* — Winston Hsu

(57) ABSTRACT

A calibration circuit configured to calibrate a signal of a sensing unit comprises: an amplifier, a first impedance element and a second impedance element. The amplifier has a first input terminal, a second input terminal and an output terminal. The first input terminal is coupled to a first terminal of the sensing unit, the second input terminal is coupled to a reference voltage, and the output terminal is feedback to the first input terminal and outputs the readout signal. A first terminal of the first impedance element is coupled to the first input terminal of the amplifier, and a second terminal of the first impedance element is coupled to a calibration voltage. A first terminal of the second impedance element is coupled to the first terminal of the first impedance element, and a second terminal of the second impedance element is coupled to the output terminal of the amplifier.

8 Claims, 5 Drawing Sheets

(58) Field of Classification Search
CPC . H03F 2203/45156; H03F 2203/45512; H03F 2203/45551; H03F 2203/45618; H03F 2203/45528; H03F 3/45475; G01D 18/00
See application file for complete search history.

(56) References Cited

U.S. PATENT DOCUMENTS

| | | | |
|---|---|---|---|
| 2015/0084876 A1* | 3/2015 | Schwartz | G06F 3/0446 345/173 |
| 2017/0033867 A1 | 2/2017 | Robinson | |
| 2018/0173342 A1* | 6/2018 | Lee | G06F 3/0418 |
| 2020/0328757 A1* | 10/2020 | Narasimman | H03M 3/458 |

FOREIGN PATENT DOCUMENTS

| | | |
|---|---|---|
| CN | 207095717 U | 3/2018 |
| CN | 108225588 A | 6/2018 |
| TW | 201445115 A | 12/2014 |

\* cited by examiner

CALIBRATION CIRCUIT FOR USE IN SENSOR AND RELATED SENSOR THEREOF

CROSS REFERENCE TO RELATED APPLICATIONS

This application claims the benefit of U.S. Provisional Application No. 62/837,736, filed on Apr. 24, 2019 and China Patent Application No. 201911119483.6, filed on Nov. 15, 2019. The entire contents of the related applications are incorporated herein by reference.

BACKGROUND OF THE INVENTION

1. Field of the Invention

The present invention relates generally to sensor, and more particularly to, a calibration circuit that is used to calibrate signals of sensing units.

2. Description of the Prior Art

A sensor typically comprises sensing units arranged in an array form. The sensing unit mainly includes an impedance element that the impedance varies with physical phenomena (such as light, heat, pressure, etc.). For example, image sensors comprise photosensitive elements. Generally, a sensing unit can be represented by a circuit model depicted in FIG. 1. When the sensing unit 10 is a resistive sensor (e.g. photoresistor), the resistor 11 can be used to simulate an impedance of the sensing unit 10 whose resistance varies with the physical phenomenon that is to be measured. The capacitor 12 can be used to simulate parasitic capacitances in the sensing unit 10. When the sensing unit 10 is a capacitive sensor, the resistance of the resistor 11 may approach infinity and the capacitance of the capacitor 12 varies with the physical phenomenon that is to be measured.

If the sensing unit 10 is a photoresistor, the resistance of the photoresistor varies with the incident light intensity. By measuring a change of a signal on the sensing unit 10, the incident light intensity can be determined. However, a problem often encountered by the design of modern sensors is that a baseline value of the sensing unit 10 is too large, which brings difficulty to detect the change of the signal. For example, in a case of resistive sensing, the resistor 11 may have a resistance of 1 MΩ (i.e., the baseline value of the sensing unit 10 in the case) when not being affected by the physical phenomenon. After affected by the physical phenomenon, a resistance change of 100Ω is produced, which leads to a change rate of 0.01% only. In a case of capacitive sensing, the capacitor 12 may have a capacitance of 100 fF (i.e., the baseline value of the sensing unit 10 in the case) when not being affected by the physical phenomenon. After affected by the physical phenomenon, a capacitance change of 0.1 fF is produced, which leads to a change rate of 0.1% only.

From above examples, it can be understood that the too large baseline value will bring difficulty to determine the signal change. In view of this, it is necessary to improve the dynamic range or the resolution in the design of back-end circuits, thereby to precisely determine the intensity of the specific physical phenomena. In addition, the conventional art also relies on long-period integration to increase the quantity of the signal change, in order to determine the intensity of the specific physical phenomena. However, improving the dynamic range or the resolution of circuits will lead to an increase in the hardware cost and the long-period integration will lead to a limitation on the output frame rate of the sensor. Thus, there is a need to provide an innovation solution to the problems of the baseline value being too large.

SUMMARY OF THE INVENTION

Embodiments of the present invention provide calibration circuits that are based on amplifiers. By setting impedance elements and a calibration voltage, the influences of baseline value on the signal readout by the amplifier can be eliminated.

According to one embodiment of the present invention, a calibration circuit is provided. The calibration circuit is configured to calibrate a signal of a sensing unit to generate a readout signal. The calibration circuit comprises: an amplifier, a first impedance element and a second impedance element. The amplifier has a first input terminal, a second input terminal and an output terminal. The first input terminal is coupled to a first terminal of the sensing unit, the second input terminal is coupled to a reference voltage, and the output terminal is feedback to the first input terminal and outputs the readout signal. A first terminal of the first impedance element is coupled to the first input terminal of the amplifier, and a second terminal of the first impedance element is coupled to a calibration voltage. A first terminal of the second impedance element is coupled to the first terminal of the first impedance element, and a second terminal of the second impedance element is coupled to the output terminal of the amplifier.

According to one embodiment of the present invention, a sensor is provided. The sensor comprises a sensing unit array and a calibration circuit. The sensing unit array comprises a plurality of sensing units. The calibration circuit is configured to calibrate a signal of a sensing unit to generate a readout signal. The calibration circuit comprises: an amplifier, a first impedance element and a second impedance element. The amplifier has a first input terminal, a second input terminal and an output terminal. The first input terminal is coupled to a first terminal of the sensing unit, the second input terminal is coupled to a reference voltage, and the output terminal is feedback to the first input terminal and outputs the readout signal. A first terminal of the first impedance element is coupled to the first input terminal of the amplifier, and a second terminal of the first impedance element is coupled to a calibration voltage. A first terminal of the second impedance element is coupled to the first terminal of the first impedance element, and a second terminal of the second impedance element is coupled to the output terminal of the amplifier.

The calibration circuit of the present invention addresses the problem that the sensing unit has too large baseline value, thereby to significantly reduce the size of the sensing unit and improve the output frame rate of the sensor. In addition, since the calibration circuit eliminates the influences of the baseline value on the readout signal, a back-end circuit will not amplify the signal component related to the baseline value when performing signal processing. A distortion in the dynamic range of the circuit will be therefore prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
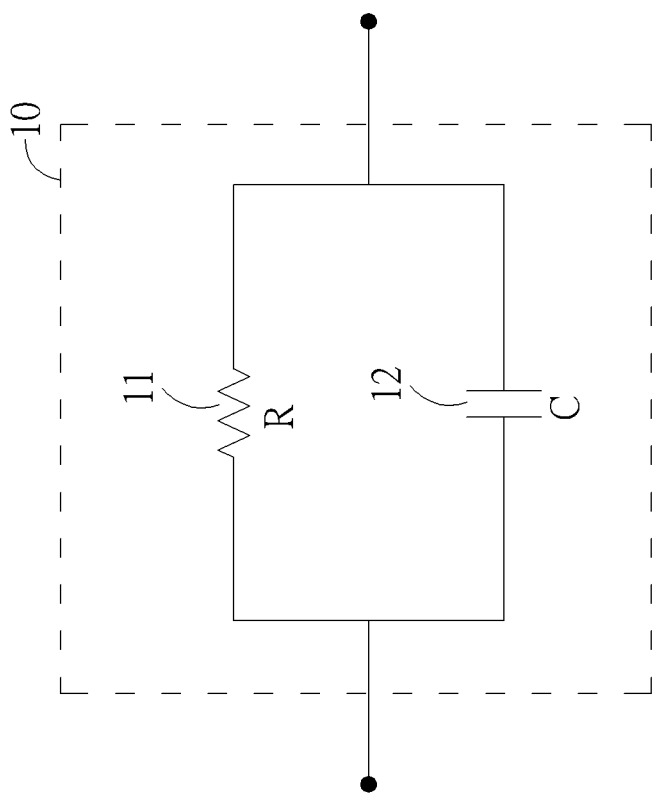
FIG. 1 illustrates a circuit model of a sensing unit.
Figure 2:
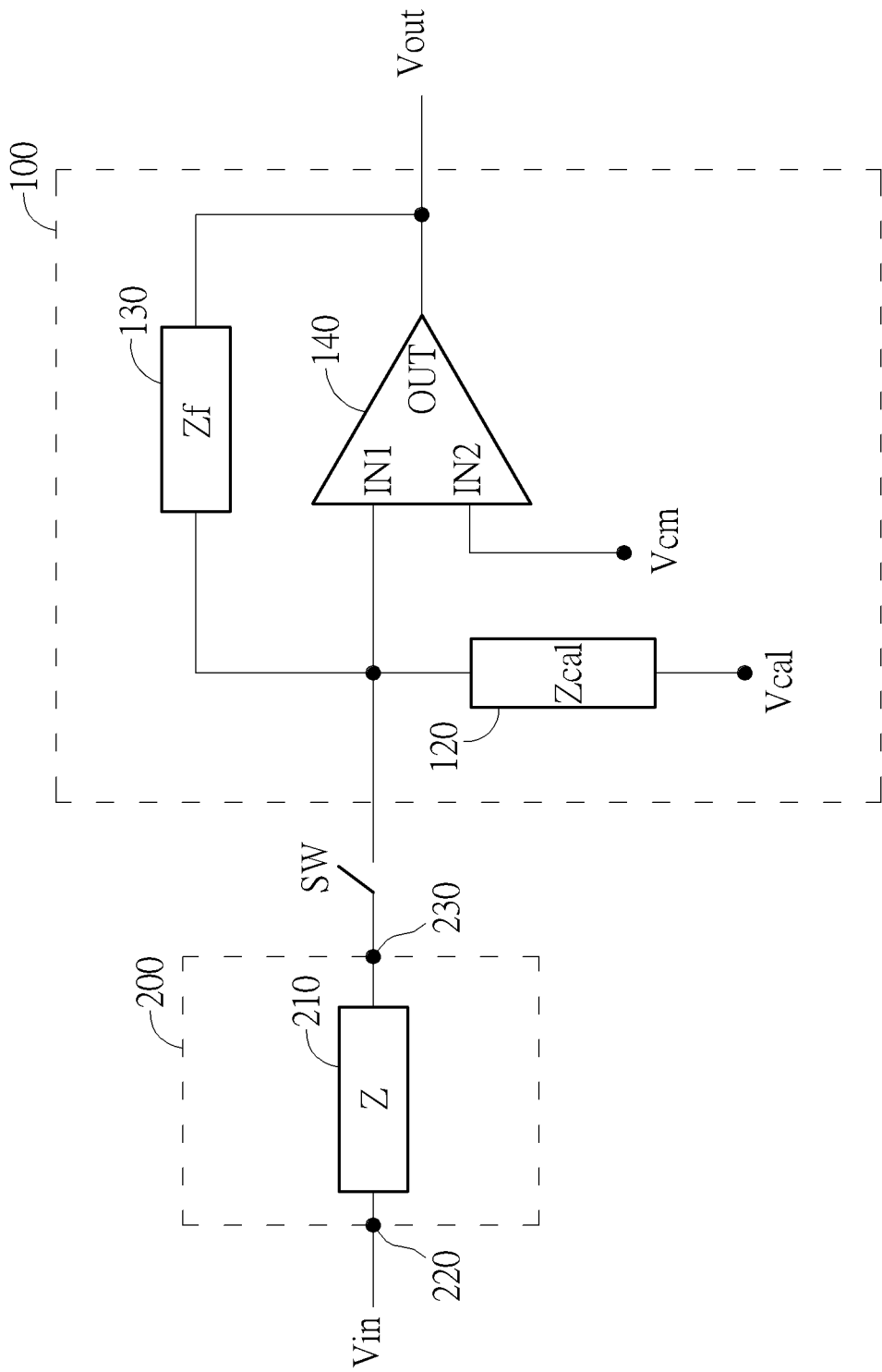
FIG. 2 illustrates a diagram regarding architecture and application of a calibration circuit according to a first embodiment of the present invention.

FIG. 2 illustrates a diagram regarding architecture and application of a calibration circuit according to a first embodiment of the present invention. As illustrated, a calibration circuit 100 is coupled to a sensing unit 200 and utilized for calibrating a signal on the sensing unit 200. The sensing unit 200 could be any component that its characteristic (e.g. impedance) may varies in response to physical phenomena (e.g. light, heat, or pressure). In one embodiment, the sensing unit 200 could be photo-sensitive elements, such as photoresistor or photodiode, which the impedance varies in response to incident light.

A terminal 220 of the sensing unit 200 is coupled to an input voltage Vin, and another terminal 230 of the sensing unit 200 is coupled to a first input terminal IN1 of the calibration circuit 100 through a switch SW. The calibration circuit 100 comprises a first impedance element 120, a second impedance element 130 and an amplifier 140. One terminal of the first impedance element 120 is coupled to the first input terminal IN1 of the amplifier 140, and another terminal of the first impedance element 120 is coupled to a calibration voltage Vcal. A second input terminal IN2 of the amplifier 140 is coupled to a reference voltage Vcm. An output terminal OUT of the amplifier 140 is feedback to the first input terminal IN1 through the second impedance element 130. Please note that the above-mentioned impedance elements 120 and 130 can be replaced with one or more components with impedances.

As mentioned above, a variable impedance element 210 in the sensing unit 200 may have a relatively large baseline value and thus brings difficulty to have the readout signal Vout reflect the impedance change accurately. Hence, the intended purpose of the calibration circuit 100 is to cancel/alleviate the influence on the readout signal Vout that is caused by the baseline value of the variable impedance element 210. As a consequence, it will be easier to have the readout signal Vout reflect the change of the impedance Z of the variable impedance element 210 in response to the incident light (or other types of physical phenomena).

In one embodiment, when the switch SW is turned on, the sensing unit 200 will be coupled to the first input terminal IN1 of the amplifier 140 in the calibration circuit 100, where the readout signal Vout obtained from the calibration circuit 100 can be expressed as the following equation (1):

$$(-Vcal/Zcal - Vin/Z + Vcm/Z//Zcal//Zf) \times Zf$$

wherein Zcal is the impendence of the first impedance element 120 and Zf is the impedance of the second impedance element 130.

If the calibration voltage Vcal is set as the inverted input voltage Vin, i.e., Vcal=−Vin and the reference voltage Vcm is set as 0, i.e., Vcm=0, and the impedance Zcal of the first impedance element 120 is set as identical to the impedance Z of the variable impedance element 210, the readout signal Vout outputted by the calibration circuit 100 can be expressed as the following equation (2):

$$Vout = (Vin \times \Delta Z/Z^2) \times Zf$$

wherein the impedance Z of the variable impedance element 210 can be further expressed as $Zo + \Delta Z$. Zo is a baseline value of the variable impedance element 210 when it is not affected by the physical phenomenon and $\Delta Z$ is the impedance change of the variable impedance element 210 when it is affected by the physical phenomenon. At the moment, if the level of the input voltage Vin and the impedance Zf of the second impedance element 130 can be properly selected to have their orders of the magnitude close or identical to the order of magnitude of the baseline impedance Zo of the variable impedance element 210, respectively, the influences on the readout signal Vout that are caused by the baseline impedance Zo can be significantly alleviated. As a result, the order of the magnitude of the readout signal Vout of the calibration circuit 100 will be controlled to be close to the order of the magnitude of the impedance change $\Delta Z$ of the variable impedance element 210.

Moreover, in accordance with the above equation (1), if the order of magnitude of the calibration voltage Vcal is close or identical to that of the input voltage Vin, and the order of magnitude of the impedance Zcal of the first impedance element 120 is close or identical to that of the baseline impedance Zo of the variable impedance element 210, it is also possible to have the order of magnitude of the readout signal Vout outputted by the calibration circuit 100 maintained as close to the order of magnitude of impedance change $\Delta Z$ of the variable impedance element 210.

Through the above manners, the readout signal Vout outputted by the calibration circuit 100 can fairly reflect the impedance change $\Delta Z$ of the variable impedance element 210. As the influenced caused by the baseline value is alleviated, the back-end circuit can more easily process the impedance change $\Delta Z$ of the variable impedance element 210 from the readout signal Vout, thereby to determine the intensity of physical phenomenon (e.g. the incident light intensity) that affects the impedance of the variable impedance element 210. It should be noted that not only the first impedance element 120 and the second impedance element 130 can be replaced by one or more components with impedance characteristics, but also the variable element 210 can be replaced by one or more components that can change its impedance in response to physical phenomena. The following embodiments will further explain how to implement the variable impedance element 210 of the present invention by different types of variable impedance elements.

Figure 3:
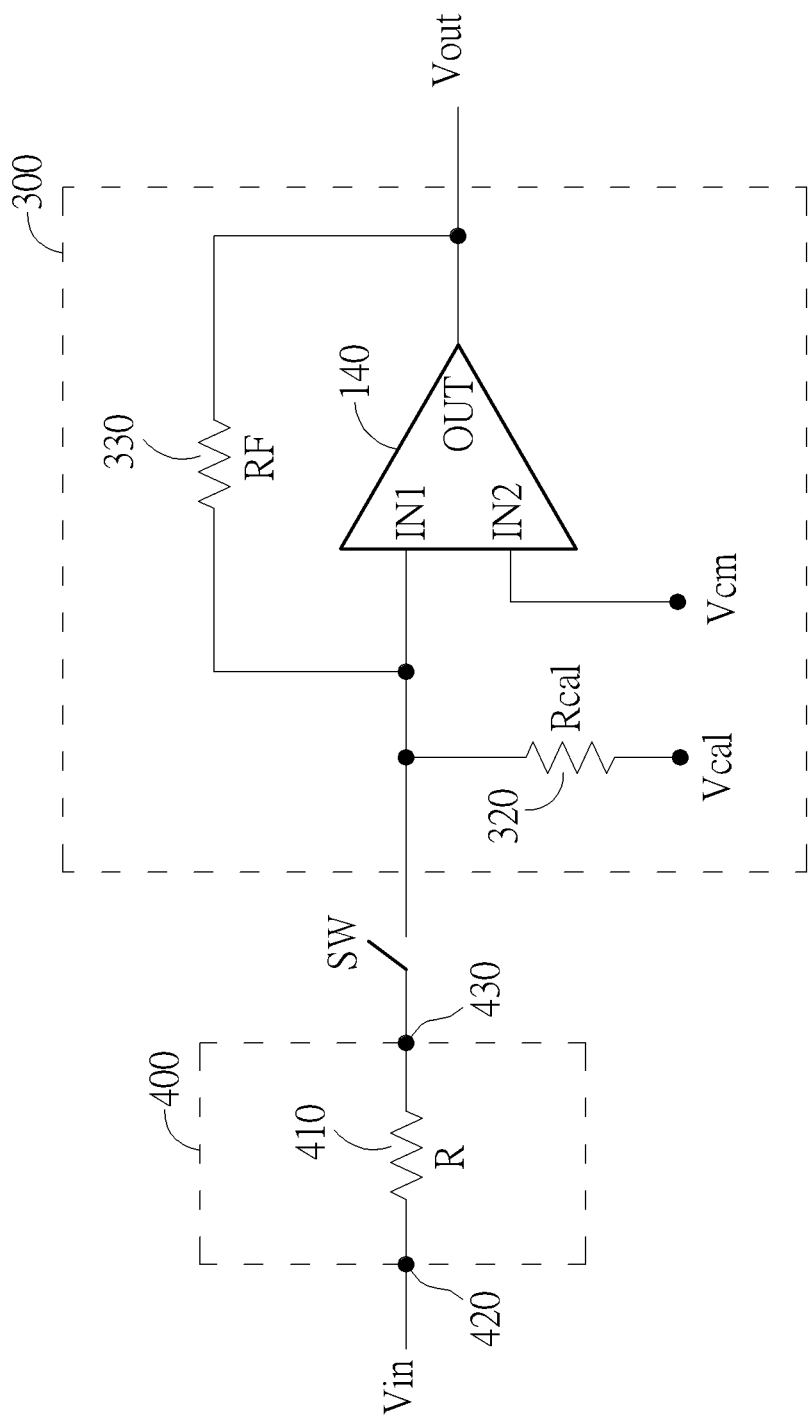
FIG. 3 illustrates a diagram regarding architecture and application of a calibration circuit according to a second embodiment of the present invention.

Please refer to FIG. 3, which illustrates a diagram regarding architecture and application of a calibration circuit according to a second embodiment of the present invention. As illustrated, a calibration circuit 300 is coupled to a sensing unit 400 to calibrate a signal on the sensing unit 400. The sensing unit 400 comprises at least one variable resistive element 410 whose resistance R can vary with specific physical phenomena, thereby to implement resistive sensing, such as, a photoresistor.

In one embodiment, a terminal 420 of the sensing unit 400 is coupled to an input voltage Vin, while another terminal 430 of the sensing unit 400 is coupled to a first input terminal IN1 of the calibration circuit 300 through a switch SW. The calibration circuit 300 comprises a first resistive element 320, a second resistive element 330 and an amplifier 140.

One terminal of the first resistive element 320 is coupled to the first input terminal IN1 of the amplifier 140, and another terminal of the first resistive element 320 is coupled to the calibration voltage Vcal. The second input terminal IN2 of the amplifier 140 is coupled to the reference voltage Vcm. Furthermore, the output terminal OUT of the amplifier 140 is feedback to first input terminal IN1 through the second resistive element 330.

The calibration circuit 300 is substantially identical to the calibration circuit 100 in functions, which makes it easier to have the readout signal Vout reflect the change of the resistance R of the variable resistance element 410 in response to the physical phenomenon by cancelling/alleviating the influences of the resistance R on the readout signal Vout. The actual manners include: setting calibration voltage Vcal as the inverted input voltage Vin, i.e., Vcal=−Vin; setting the reference voltage Vcm as 0, i.e., Vcm=0; and setting the resistance Rcal of the first resistive element 320 as identical to the baseline resistance Ro of the variable resistance element 410. In addition, set the order of magnitude of the input voltage Vin and the order of magnitude of the resistance Rf of the second resistive element 330 as close or identical to the baseline resistance Ro of the variable resistance element 410.

Alternatively, by setting the order of magnitude of the calibration voltage Vcal close or identical to the order of magnitude of the input voltage Vin, and setting the order of magnitude of the resistance Rcal of the first resistive element 320 close or identical to the baseline resistance Ro of the variable resistive element 410, it will also be easier to have the readout signal Vout to reflect the change of the resistance R of the variable resistive element 410 in response to the specific physical phenomenon.

Figure 4:
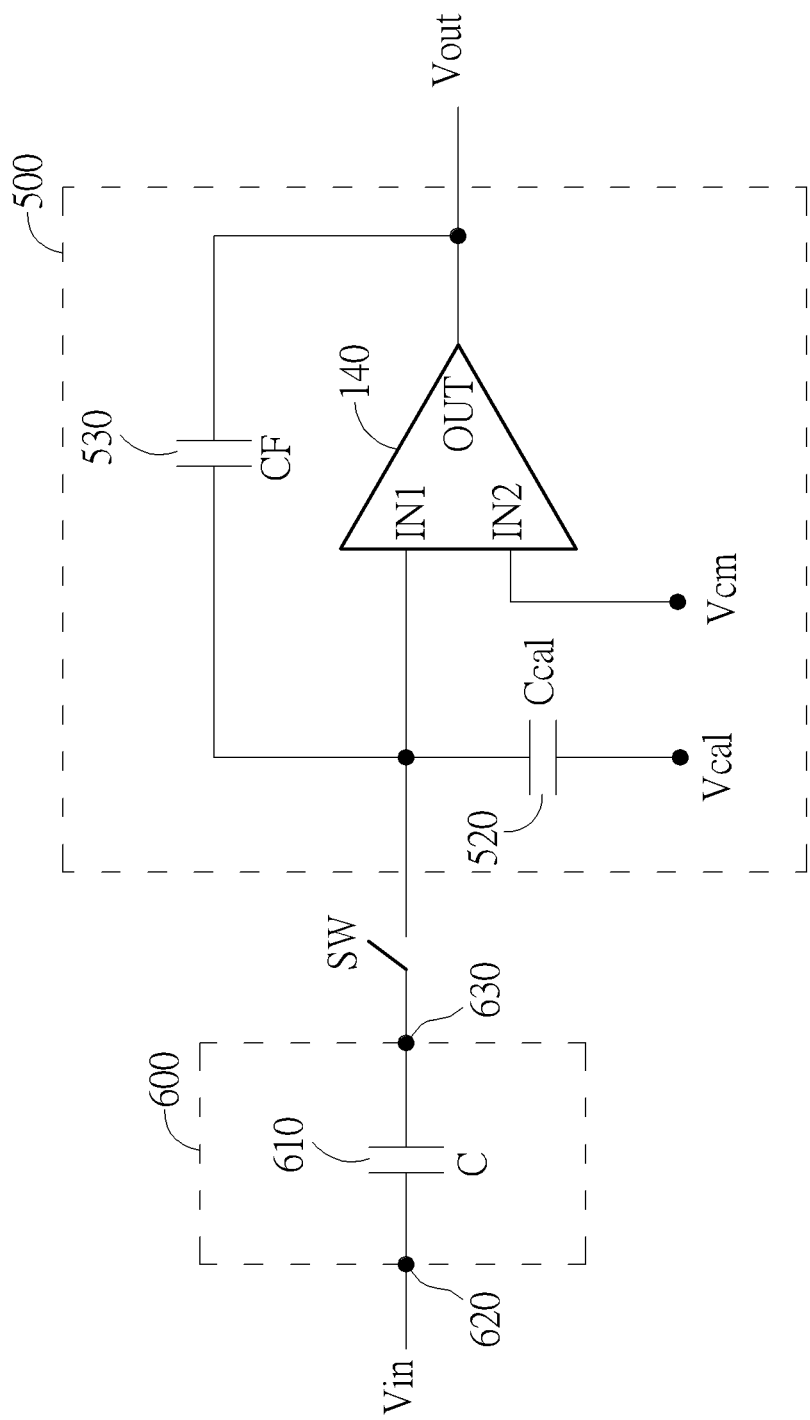
FIG. 4 illustrates a diagram regarding architecture and application of a calibration circuit according to a third embodiment of the present invention.

Please refer to FIG. 4, which illustrates a diagram regarding architecture and application of a calibration circuit according to a third embodiment of the present invention. As illustrated, a calibration circuit 500 is coupled to a sensing unit 600 and configured to calibrate a signal on the sensing unit 600. In this embodiment, the sensing unit 600 comprises at least one variable capacitive element 610 whose capacitance C would vary with specific physical phenomena, thereby to implement capacitive sensing.

In one embodiment, a terminal 620 of the sensing unit 600 is coupled to an input voltage Vin, while another terminal 630 of the sensing unit 600 is coupled to a first input terminal IN1 of the calibration circuit 500 through a switch SW. The calibration circuit 500 comprises a first capacitive element 520, a second capacitive element 530 and an amplifier 140. One terminal of the first capacitive element 520 is coupled to the first input terminal IN1 of the amplifier 140, and another terminal of the first capacitive element 520 is coupled to the calibration voltage Vcal. The second input terminal IN2 of the amplifier 140 is coupled to the reference voltage Vcm. Furthermore, the output terminal OUT of the amplifier 140 is feedback to first input terminal IN1 through the second capacitive element 530.

The calibration circuit 500 is substantially identical to the calibration circuit 100 in functions, which make it easier to have the readout signal Vout reflect the change of the capacitance C of the variable capacitive element 610 in response to the intensity of physical phenomenon, by cancelling/alleviating the influenced of the baseline value of the sensing unit 600 applying on the readout signal Vout. The actual manners includes: setting the calibration voltage Vcal as the inverted input voltage Vin, i.e., Vcal=−Vin; setting the reference voltage Vcm as 0, i.e., Vcm=0; and setting the capacitance Ccal of the first capacitive element 520 identical to the capacitance C of the variable capacitive element 610. Additionally, set the order of magnitude of the input voltage Vin and the order of magnitude of capacitance Cf of the second capacitive element 530 as close or identical to the order of magnitude of a baseline capacitance Co of the variable capacitive element 610.

Alternatively, if the order of magnitude of the calibration voltage Vcal is set as close or identical to that of the input voltage Vin, and the order of magnitude of the capacitance Ccal of the first capacitive element 520 is set as close or identical to that of the baseline capacitance Co of the variable capacitive element 610, it will also be easier to have the readout signal Vout reflect the change of the capacitance C of the variable capacitance element 610 in response to the physical phenomenon.

Figure 5:
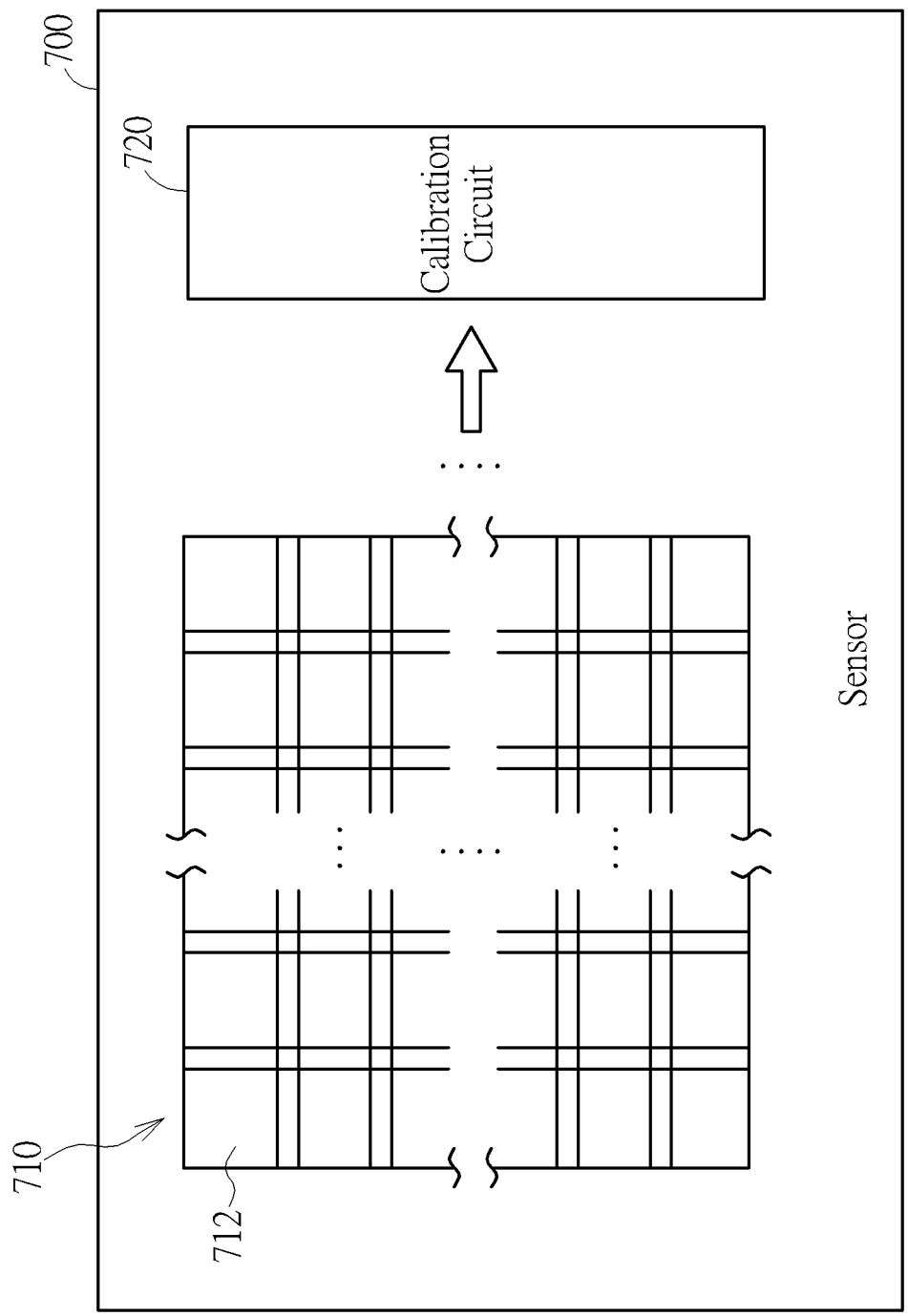
FIG. 5 illustrates a diagram of architecture of a sensor according to a fourth embodiment of the present invention.

FIG. 5 illustrates architecture of a sensor according to one embodiment of the present invention. As illustrated, the sensor 700 comprises a sensing unit array 710 and the sensing unit array 710 comprises a plurality of sensing units 712 that are arranged in an array form. The impedance of each sensing unit 712 would vary with specific physical phenomena (e.g. light, heat, pressure), thereby to detect intensities of the specific physical phenomena. Moreover, the sensor 700 comprises a calibration circuit 720. The calibration circuit 720 could be any one of the calibration circuit 100, 300 or 500, which depends on the impedance type of the sensing unit 712, e.g., resistive or capacitive. As mentioned above, with the calibration circuit 720, the sensor can have a great output frame rate and dynamic range.

In conclusion, the calibration circuit of the present invention addresses the problems that the baseline value of the sensing unit is too larger. Therefore, it brings several advantages to the sensor design. First, in the conventional design, it is necessary to introduce extra control signals and buffers in the sensing units to have the sensed signal fairly reflect the signal change in response to the intensity of the physical phenomenon, thereby to overcome the influences of the too larger baseline value. However, this will lead to an increase in the size of the sensing unit. In contrast to this, the calibration circuit of present invention can significantly reduce the size of the sensing unit. Moreover, the conventional art also increases the quantity of signal change through long-period integration or exposure in order to overcome the influences of the too large baseline value, but this manner will inevitably limit the output frame rate of the sensor. With the calibration circuit of the present invention, the output frame rate can be significantly improved. Moreover, since the calibration circuit of the present invention eliminates the influences of the baseline value applying on the readout signal, a back-end circuit will not amplify the signal component related to the baseline value when performing signal processing. A distortion in the dynamic range of the circuit will be therefore prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A calibration circuit configured to calibrate a signal on a sensing unit to generate a readout signal, comprising:
  an amplifier having a first input terminal, a second input terminal and an output terminal, wherein the first input terminal is coupled to a first terminal of the sensing unit, the second input terminal is coupled to a reference voltage, and the output terminal is feedback to the first input terminal and outputs the readout signal;

a first impedance element, wherein a first terminal of the first impedance element is coupled to the first input terminal of the amplifier, and a second terminal of the first impedance element is coupled to a calibration voltage; and a second impedance element, wherein a first terminal of the second impedance element is coupled to the first terminal of the first impedance element, and a second terminal of the second impedance element is coupled to the output terminal of the amplifier;

wherein the calibration voltage is identical in magnitude and opposite in phase to an input voltage at a second terminal of the sensing unit.

2. The calibration circuit of claim 1, wherein the impedance of the first impedance element is identical to a baseline impedance of a variable impedance element in the sensing unit.

3. The calibration circuit of claim 1, wherein an order of magnitude of an impedance of the second impedance element is identical to an order of magnitude of a baseline impedance of a variable impedance element in the sensing unit.

4. The calibration circuit of claim 1, wherein an order of magnitude of the input voltage is identical to an order of magnitude of the calibration voltage, and an order of magnitude of an impedance of the first impedance element is identical to an order of magnitude of a baseline impedance of a variable impedance element in the sensing unit.

5. A sensor, comprising:

a sensing unit array having a plurality of sensing units; and a calibration circuit, configured to calibrate a signal of a sensing unit to generate a readout signal, comprising:

an amplifier having a first input terminal, a second input terminal and an output terminal, wherein the first input terminal is coupled to a first terminal of the sensing unit, the second input terminal is coupled to a reference voltage, and the output terminal is feedback to the first input terminal and outputs the readout signal;

a first impedance element, wherein a first terminal of the first impedance element is coupled to the first input terminal of the amplifier, and a second terminal of the first impedance element is coupled to a calibration voltage; and a second impedance element, wherein a first terminal of the second impedance element is coupled to the first terminal of the first impedance element, and a second terminal of the second impedance element is coupled to the output terminal of the amplifier;

wherein the calibration voltage is identical in magnitude and opposite in phase to an input voltage at a second terminal of the sensing unit.

6. The sensor of claim 5, wherein the impedance of the first impedance element is identical to a baseline impedance of a variable impedance element in the sensing unit.

7. The sensor of claim 5, wherein an order of magnitude of an impedance of the second impedance element is identical to an order of magnitude of a baseline impedance of a variable impedance element in the sensing unit.

8. The sensor of claim 5, wherein an order of magnitude of the input voltage is identical to an order of magnitude of the calibration voltage, and an order of magnitude of an impedance of the first impedance element is identical to an order of magnitude of a baseline impedance of a variable impedance element in the sensing unit.

* * * * *